United States Patent
Miya (10) Patent No.: US 7,764,142 B2
(45) Date of Patent: Jul. 27, 2010

(54) SERIES CONNECTED BIT PHASE SHIFTER HAVING FIRST AND SECOND IMPEDANCE ADJUSTING CIRCUITS

(75) Inventor: Tatsuya Miya, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 28 days.

(21) Appl. No.: 12/023,053

(22) Filed: Jan. 31, 2008

(65) Prior Publication Data
US 2008/0186108 A1  Aug. 7, 2008

(30) Foreign Application Priority Data
Feb. 2, 2007  (JP)  ............... 2007-024235

(51) Int. Cl.
*H03H 7/20* (2006.01)
*H01P 1/18* (2006.01)
(52) U.S. Cl. ....................... 333/139; 333/164
(58) Field of Classification Search .......... 333/164, 333/139, 140, 156
See application file for complete search history.

(56) References Cited
U.S. PATENT DOCUMENTS

| | | | | |
|---|---|---|---|---|
| 4,612,520 A | * | 9/1986 | Boire et al. | ............ 333/156 |
| 5,307,033 A | * | 4/1994 | Koscica et al. | ............ 333/161 |
| 5,424,696 A | | 6/1995 | Nakahara et al. | |
| 6,078,228 A | * | 6/2000 | Mannerstrale | ............ 333/139 |
| 6,806,792 B2 | * | 10/2004 | Penn | ............ 333/164 |
| 2006/0001507 A1 | * | 1/2006 | Nakamura | ............ 333/164 |

FOREIGN PATENT DOCUMENTS

| JP | 62-226708 | 10/1987 |
|---|---|---|
| JP | 8-213868 | 8/1996 |
| JP | 2679331 | 8/1997 |
| JP | 2898470 | 3/1999 |
| JP | 3031227 | 2/2000 |
| JP | 3076350 | 6/2000 |
| JP | 2002-076810 | 3/2002 |
| JP | 2006-019823 | 1/2006 |

OTHER PUBLICATIONS

Japanese Patent Office issued a Japanese Office Action dated Apr. 2, 2010, Application No. 2007-024235.

* cited by examiner

*Primary Examiner*—Benny Lee
(74) *Attorney, Agent, or Firm*—Young & Thompson (57) ABSTRACT

A bit phase shifter includes a plurality of phase shifters having phase shift amounts and connected in series through connection paths; and a first adjusting circuit provided in the connection path between every adjacent two of the plurality of phase shifters. The first adjusting circuit includes a first inductance which attains impedance matching to each of capacitances provided by the adjacent two phase shifters.

12 Claims, 13 Drawing Sheets

ENTER IN PART: /B.T.L./

Fig. 8

ENTER IN PART: /B.T.L./

Fig. 9

ENTER IN PART: /B.T.L./

SERIES CONNECTED BIT PHASE SHIFTER HAVING FIRST AND SECOND IMPEDANCE ADJUSTING CIRCUITS

BACKGROUND OF THE INVENTION

1. Field of the Invention

The present invention relates to a bit phase shifter for a high frequency signal. This Patent Application is based on Japanese Patent Application No. 2007-024235. The disclosure of the Japanese Patent Application is incorporated herein by reference.

2. Description of Related Art

A phased array technique has been applied to a microwave band in recent years. A phase shifter is indispensable in communication using the phased array technique. Especially, at present, a bit phase shifter is used in which a plurality of phase shift amounts can be set at a same phase interval. The bit phase shifter is configured by connecting a plurality of phase shifters having predetermined phase shift amounts in cascade. Recently, a phase shifter with higher performance, i.e. a bit phase shifter with small reflection and small phase errors, is required. However, when the bit phase shifter is used for a high frequency signal, there is a case that the bit phase shifter is not necessarily made to have high performance even if individual phase shifters are made to have high performance and connected in multiple stages. Thus, the ability to change the conventional bit phase shifter to a high performance circuit has been limited.

Figure 1:
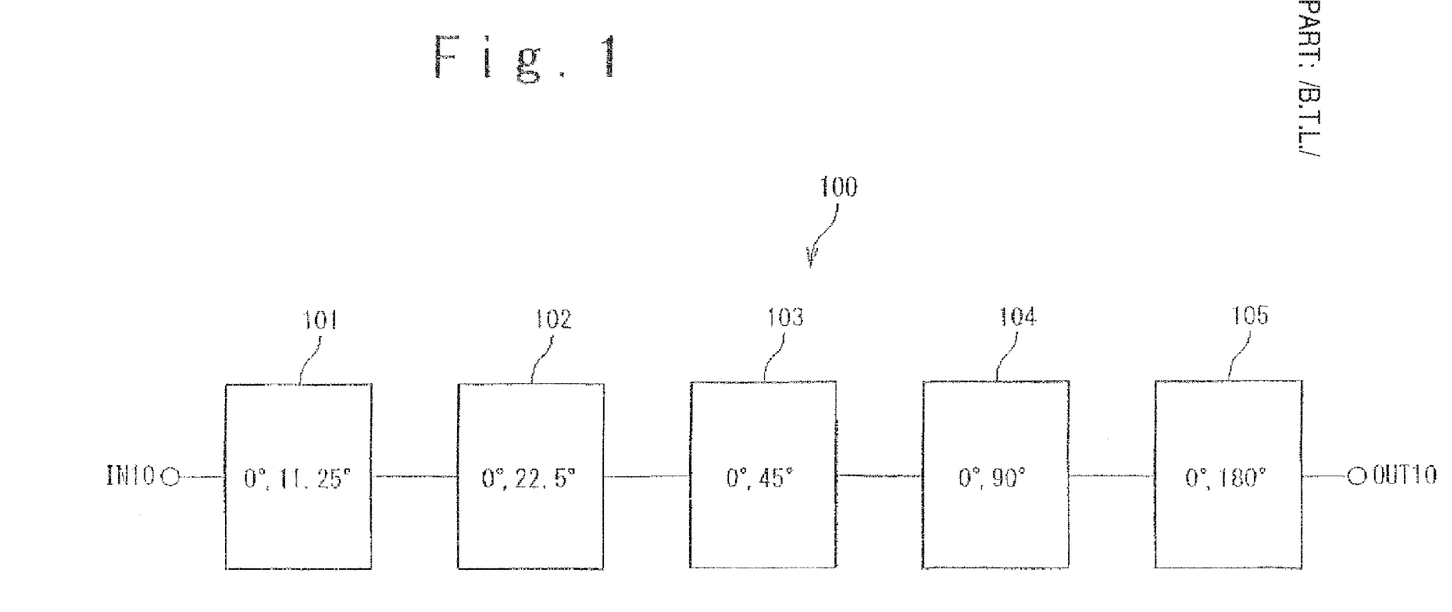
FIG. 1 is a diagram showing a configuration of a conventional bit phase shifter.

The bit phase shifter is generally configured by connecting phase shifters with fixed phase shift amounts in multiple stages. FIG. 1 is a diagram showing the configuration of a bit phase shifter described in Japanese Patent No. 2898470 (a first conventional example). In FIG. 1, a bit phase shifter 100 is configured by connecting five phase shifters 101, 102, 103, 104, and 105 in cascade, where the phase shifters have different fixed phase shift amounts, namely 0° to 11.25 degrees, 22.5 degrees, 45 degrees, 90 degrees, and 180 degrees, respectively. The bit phase shifter 100 can accomplish the phase shift amounts of 32 patterns from 0 to 360 degrees at the interval of 11.25 degrees through on/off combinations of the phase shifters 100 to 105. If digital data "10000" is supplied to the bit phase shifter 100, the phase shifter 101 is exclusively turned on and the phase shift amount of 11.25 degrees can be obtained. At this time, a signal is inputted from an input terminal IN10 and is outputted from an output terminal OUT10 to have the phase shift amount of 11.25 degrees. Moreover, if digital data "01000" is supplied, the phase shifter 102 is exclusively turned on and the phase shift amount of 22.5 degrees can be obtained. If digital data "11000" is supplied, the phase shifters 101 and 102 are turned on, and the phase shift amount of 33.75 degrees can be obtained. If digital data "11111" is supplied, all of the phase shifters 101 to 105 are turned on, and the phase shift amount of 348.75 degrees can be obtained.

In each of the phase shifters with fixed phase shift amounts that constitute the bit phase shifter, a method of switching a plurality of signal paths by SPDT (single pole double throw) switches is employed in order to obtain the phase shift amount by using a phase difference between the different signal paths. A switching type of phase shifter used widely will be described below.

Figure 2:
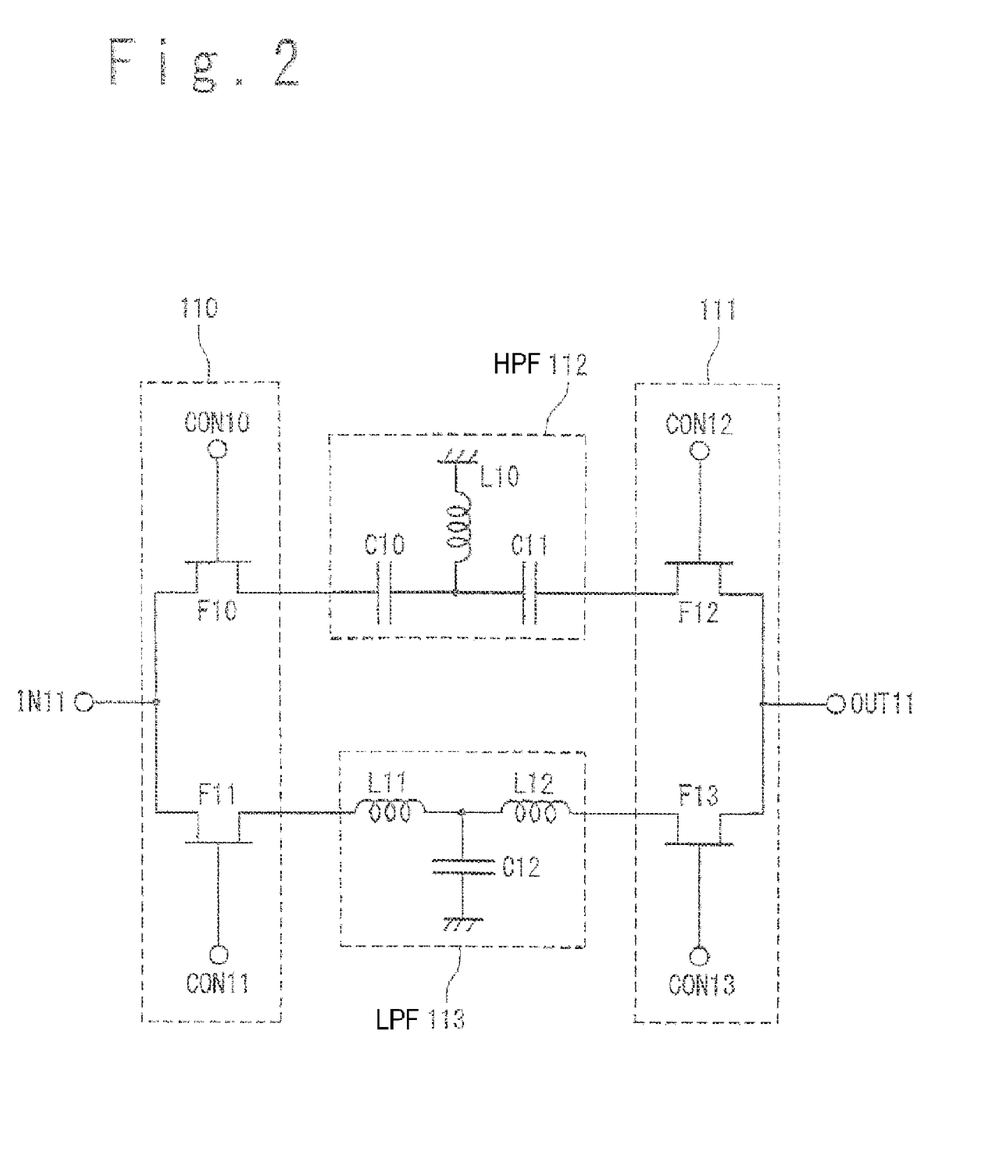
FIG. 2 is a circuit diagram showing a configuration of a conventional HPFLPF switching type of phase shifter.

First, an HPFLPF (high pass filter, low pass filter) switching type of phase shifter will be described, with reference to Japanese Patent No. 2679331 (a second conventional example). FIG. 2 shows the circuit configuration of the HPFLPF switching type of phase shifter. The phase shifter shown in FIG. 2 is configured of SPDT switches 110 and 111, an HPF 112, and an LPF 113 connected between input terminal IN11 and output terminal OUT11. A signal path on the HPF 112 side and a signal path on the LPF 113 side are switched by turning on/off FETs F10, F11, F12, and F13 (controlled by respective control signals CON10, CON11, CON12, and CON13) in the SPDT switches 110 and 111. The HPF 112 is composed of capacitors C10 and C11 connected in series and an inductor L10 connected between a node between the capacitors C10 and C11 and a ground, while the LPF 113 is composed of inductors L11 and L12 connected in series and a capacitor C12 connected between a node between the inductors C10 and C11 and the ground. A phase can be arbitrarily designed in a desired frequency by selecting circuit constants of these capacitors C10 to C12 and these inductors L10 to L12. A difference between phases of signals passing through the HPF 112 and the LPF 113 can be obtained as a phase shift amount by switching the signal paths using the SPDT switches 110 and 111.

Figure 3:
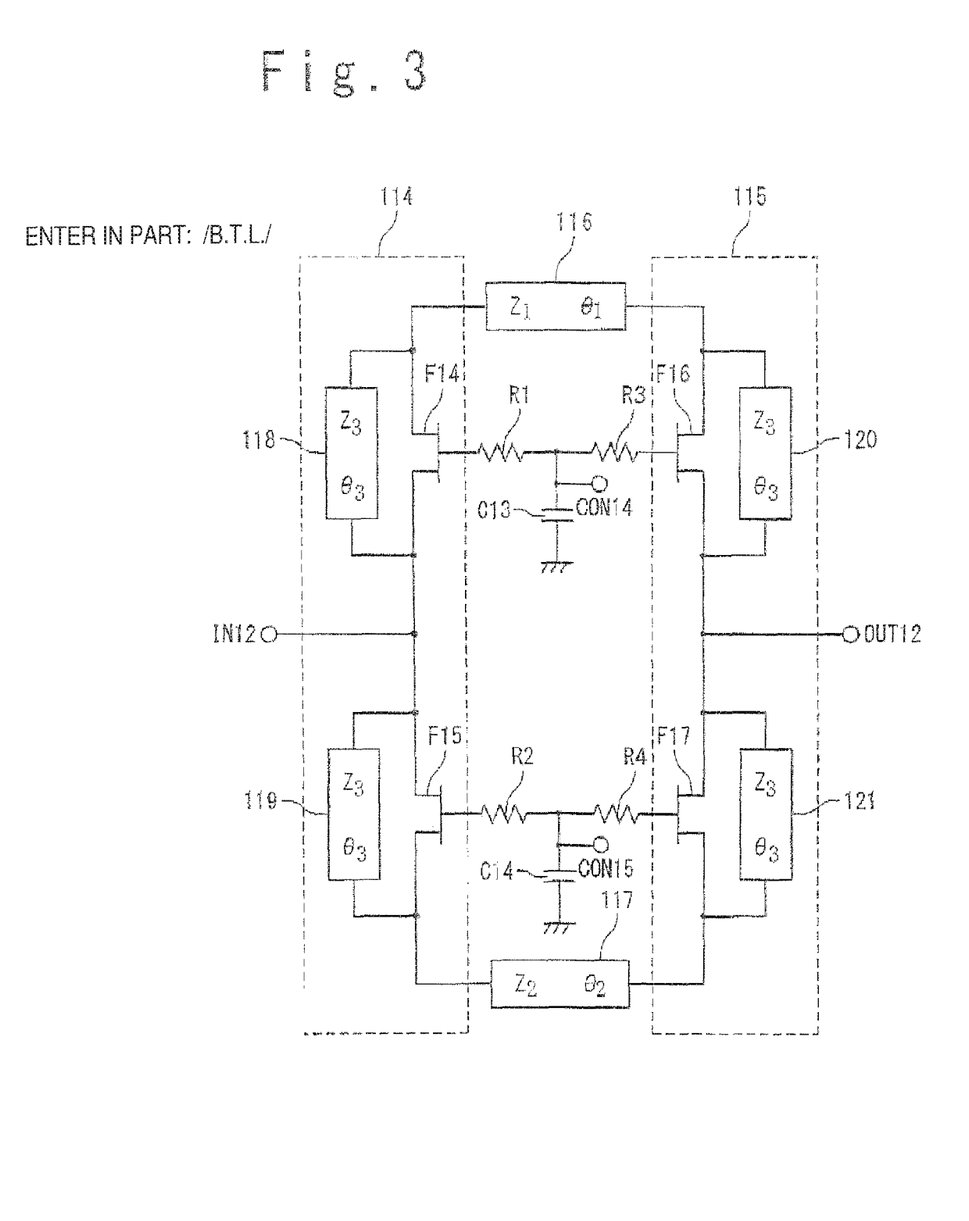
FIG. 3 is a circuit diagram showing a configuration of a conventional switched line type of phase shifter.

Next, a switched line type of phase shifter will be described with reference to Japanese Patent Application Publication (JP-A-Heisei 8-213868) (a third conventional example). FIG. 3 is a diagram showing the circuit configuration of the switched line type of phase shifter. In FIG. 3, a signal is inputted to an input terminal IN12, and is outputted from an output terminal OUT12. Complementary on/off control of FETs F14 and F15 in an SPDT switch 114 is realized based on control voltages which are applied to control terminals CON14 and CON15 in a complementary manner. Complementary on/off control of FETs F16 and F17 is also realized based on control voltages which are applied to the control terminals CON14 and CON15. Each of parallel resonance transmission lines 118, 119, 120, and 121 has impedance $Z_3$ and an angle $\Theta_3$, and is connected in parallel between a source electrode and a drain electrode of one of the FETs F14 to F17. Resistors R1, R2, R3, and R4 are connected between the control terminals CON14 and CON15 and gate electrodes of the FETs F14 to F17, respectively. Capacitors C13 and C14 prevent leakage of the signal. A reference transmission line 116 has impedance $Z_1$ and an angle $\Theta_1$, while a delay transmission line 117 has impedance $Z_2$ and an angle $\Theta_2$. In FIG. 3, the switched line type of phase shifter can obtain a difference between phases of signals passing through the reference transmission line 116 and the delay transmission line 117 as a phase shift amount by switching signal paths using the SPDT switches 114 and 115.

Figure 4:
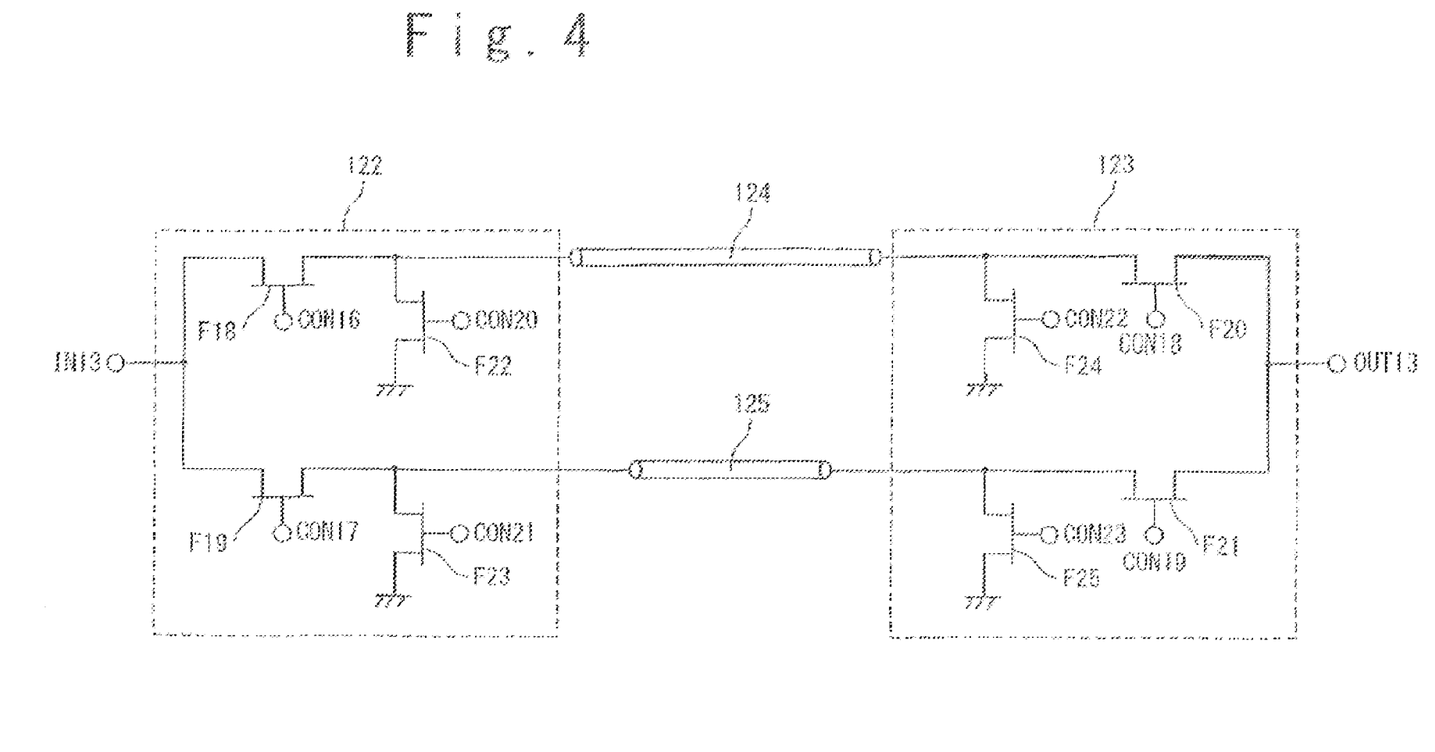
FIG. 4 is a circuit diagram showing the configuration of another conventional switched line type of phase shifter.

Further, a switched line type of phase shifter as another example will be described with reference to Japanese Patent No. 3076350 (a fourth conventional example) in which the SPDT switches are of a series shunt type. FIG. 4 is a diagram showing the circuit configuration of the switched line type of phase shifter. In FIG. 4, a signal is inputted to an input terminal IN13, and is outputted from an output terminal OUT13. An input-side SPDT switch 122 has FETs F18 and F19 connected to the input terminal and shunt FETs F22 and F23. An output-side SPDT switch 123 has FETs F20 and F21 connected to the output terminal and shunt FETs F24 and F25. In the input-side SPDT switch 122, complementary on/off control of the FETs F18 and F23, and the FETs F19 and F22 is realized based on control voltages which are applied to control terminals CON16 and CON21, and control terminals CON17 and CON20 in a complementary manner. In the output-side SPDT switch 123, complementary on/off control of the FETs F20 and F25, and the FETs F21 and F24 is realized based on control voltages which are applied to control terminals CON 18 and CON 23, and control terminals CON19 and CON22 in a complementary manner. A delay amount in the delay transmission line 124 is increased more than that of the reference transmission line 125 by a desired phase shift amount. In FIG. 4, the switched line type of phase shifter can obtain a difference between phases of signals passing through the reference transmission line 125 and the delay transmission line 124 as a phase shift amount by switching signal paths using the SPDT switches 122 and 123.

Next, a phase shifter used for a high frequency signal will be described. In the phase shifter for the high frequency signal, a switch section for switching signal paths includes SPDT switches which can be used for the high frequency signal at present. FIGS. 3 and 4 show examples of the phase shifter for the high frequency signal using SPDT switches. In the SPDT switches 110 and 111 shown in the phase shifter of FIG. 2, isolation cannot be obtained in the high frequency signal because of off capacitances of the FETs F11 and F13 or the FETs F10 and F12 in the off state. Therefore, in the SPDT switches 114 and 115 shown in the phase shifter of FIG. 3, the parallel resonance transmission lines 118 to 121, which are equivalent to inductors, are connected between drains and sources of the FETs F14 to F17. The off capacitances of the FETs F15 and F17 or the FETs F14 and F16 in the off state are subjected to parallel resonance with the parallel resonance transmission lines 119 and 121 or the parallel resonance transmission lines 118 and 120 in order to suppress deterioration of isolation characteristics. In the present application, an SPDT switch in which an inductor is provided to parallel-resonate with an off capacitance on the signal path is referred to as a resonance type of SPDT switch.

The input-side SPDT switch 110 of FIG. 2 is configured of only two of the FETs F10 and F11. On the contrary, in the input-side SPDT switch 122 of FIG. 4, deterioration of isolation characteristics is suppressed by adding the shunt FETs F22 and F23 in addition to two of the series FETs F18 and F19. Deterioration of isolation characteristics is also suppressed in the output-side SPDT switch 123 by adding the shunt FETs F24 and F25 to two of the FETs F20 and F21. In the present application, an SPDT switch in which a circuit element having an off capacitance is provided for a shunt circuit is referred to as a series shunt type of SPDT switch.

In this way, the switching type of phase shifter is widely used for a high frequency signal. As the SPDT switch of the phase shifter for a high frequency signal, the resonance type of SPDT switch shown as the SPDT switches 114 and 115 in FIG. 3 and the series shunt type of SPDT switch shown as the SPDT switches 122 and 123 in FIG. 4 are widely used.

Next, a phase shifter to control switching of signal paths by using a positive power supply will be described. In this phase shifter, the SPDT switches are turned on/off by using a positive power supply voltage. This control is realized at present without short-circuiting a drain and source of each FET as a switch element to a ground in a DC manner. That is, a voltage equal to or larger than a pinch-off voltage of the FET is applied to a gate electrode of the FET in a floating state between the drain and source of the FET. Thus, the FET in which a high voltage is applied between the drain and source is turned on, and the FET in which a low voltage is applied between the drain and source is turned off. Thus, an on/off control of the switch elements can be realized only by positive power supply voltages such as 0V and +3V. Such a technique is described in Japanese Patent No. 3031227 (a fifth conventional example). In a switch without shunt FETs such as the SPDT switches 110 and 111 of FIG. 2 and the SPDT switches 114 and 115 of FIG. 3, a positive power supply voltage can be used if the switch common terminals IN11, OUT11, IN12 and OUT12 are not directly connected to the ground but are in the floating state.

In addition, Japanese Patent Application Publication (JP-A-Showa 62-226708) (a sixth conventional example) describes a technique in which a choke coil is inserted into a connection path between one phase shifter and another phase shifter, which are used for a bit phase shifter. This choke coil has a function to connect only a DC component to a ground and to pass an AC component.

A phase shifter with a predetermined phase shift amount is designed so that the desired characteristics can be obtained as a single phase shifter. A bit phase shifter generally includes the phase shifters connected in multiple stages and could obtain characteristics determined based on the characteristics of the individual phase shifters. However, extremely severe characteristics are required for a high frequency signal. Even if individual phase shifters have excellent performances, it does not necessarily mean that sufficient high-frequency characteristics are obtained in a bit phase shifter composed of the phase shifters. In the bit phase shifter, a phase error is increased from a C band (4 to 8 GHz), and it is impossible to obtain sufficient characteristics determined based on characteristics of individual phase shifters in bands equal to or higher in frequency than an X band (8 to 12 GHz).

As the above reason, the conclusion can be obtained that a slight deviation from characteristic impedance in each phase shifter is accumulated by connecting the phase shifters one after another. In the bit phase shifter composed of the phase shifters connected in multiple stages, a return loss is degraded and original phase shift amounts of the phase shifters cannot be obtained. Thus, performance of the bit phase shifter is deteriorated significantly. It was discovered in the conventional bit phase shifter that a return loss is decreased and a phase error is increased (a return loss is 0 dB when entire power is reflected and returned, and a return loss is infinite when there is no reflection and entire power is absorbed).

It should be noted that in IEEE, the frequency band is classified by using alphabet characters. The high frequency bands are named as an I band, G band, P band, L band, S band, C band (4 to 8 GHz), X band (8 to 12 GHz), Ku band (12 to 18 GHz), K band (18 to 26 GHz), Ka band, V band, and W band from a lower frequency band. In the present application, frequency bands equal to or higher in frequency than the C band are the objective. Therefore, when a "high frequency signal" or a "high frequency band" is mentioned in the present application, it means a signal in a frequency bands equal to or higher in frequency than the C band.

A slight deviation from characteristic impedance caused when the phase shifters are used for a high frequency signal was discovered to be a deviation in a specific relationship. That is, in the phase shifters for the high frequency signal, the switches that can attain isolation in the high frequency bands need to be used, such as the resonance type of switches and the series shunt type of switches shown in FIGS. 3 and 4, as SPDT switches. However, these SPDT switches were discovered to have a problem in the high frequency bands.

Figure 5A:
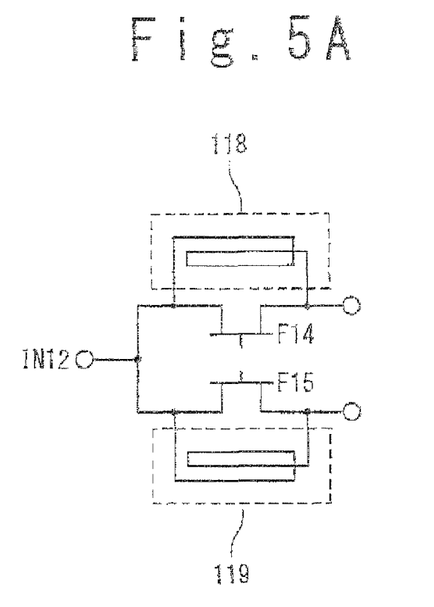
FIGS. 5A and 5B are diagrams showing equivalent circuits of an SPDT switch.
Figure 5B:
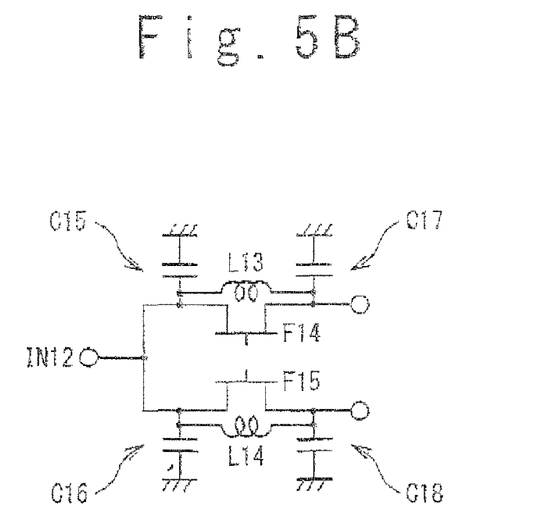

The resonance type of SPDT switch will be described with reference to the SPDT switch 114 of FIG. 3. The parallel resonance transmission lines 118 and 119 connected to obtain isolation have distributed constant components in a high frequency band. Accordingly, the SPDT switch 114 has an equivalent circuit shown in FIG. 5A in lower frequency bands and an equivalent circuit shown in FIG. 5B in the high frequency bands. FIG. 5A includes the above-mentioned parallel resonance transmission lines 118 and 119, FETs F14 and F15 and input terminal IN12. In FIG. 5B, which includes input terminal IN12, an inductor L13 which resonates with an off capacitance in an off state is inserted in parallel to an FET F14. Simultaneously, capacitors C15 and C17 having small capacitances are connected to shunt. An inductor L14 which resonates with an off capacitance in an off state is also inserted in parallel to an FET F15, and capacitors C16 and C18 having small capacitances are connected to shunt. Accordingly, the impedance of the phase shifter shown in FIG. 3 is changed to capacitive impedance by the very small capacitances of the capacitors C15 to C18.

Figure 6:
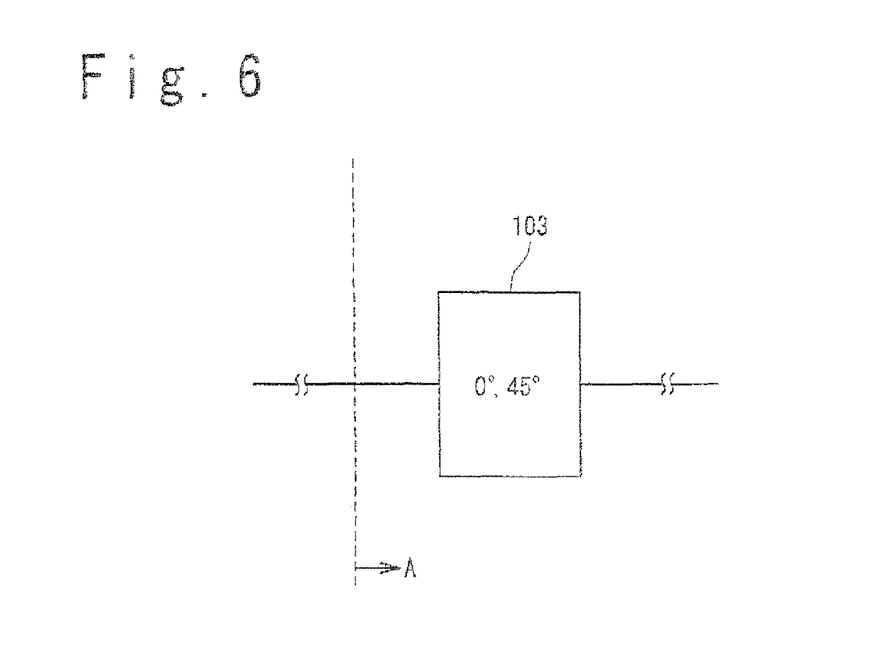
FIG. 6 is a diagram showing impedance relation of phase shifters.
Figure 7:
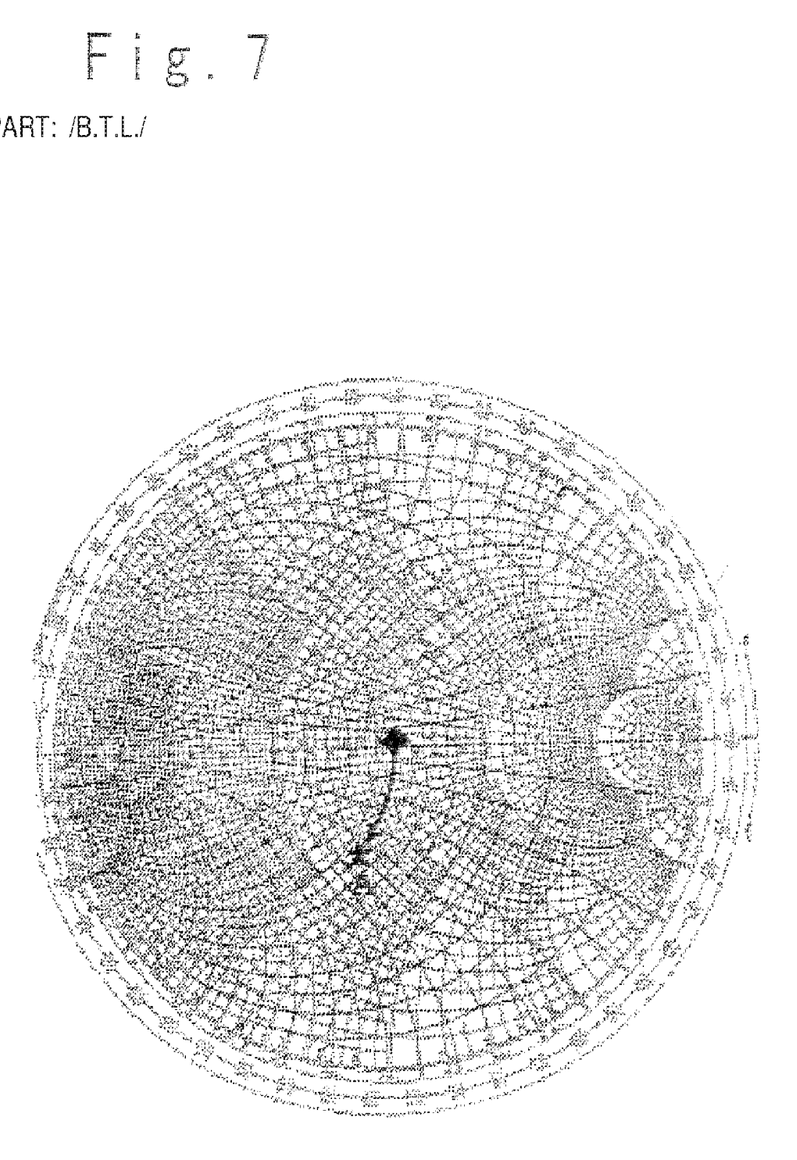
FIG. 7 is a Smith chart showing the impedances of phase shifters.

For example, suppose that the bit phase shifter shown in FIG. 1 contains the phase shifters shown in FIG. 3 connected in cascade. At this time, a position of impedance of the phase shifter 103 (described above) viewed from a dotted line A as shown in FIG. 6 could be shown on a Smith chart as shown in FIG. 7. If each of the phase shifters 101 to 105 of FIG. 1 is configured of same SPDT switches, similar capacitive impedance is obtained in the phase shifter. In the single phase shifter shown in FIG. 3, even if impedance is slightly deviated from 50 ohm, a return loss is almost free from deterioration. However, when the two phase shifters are connected, reflection is increased so that return loss is significantly decreased.

Figure 8:
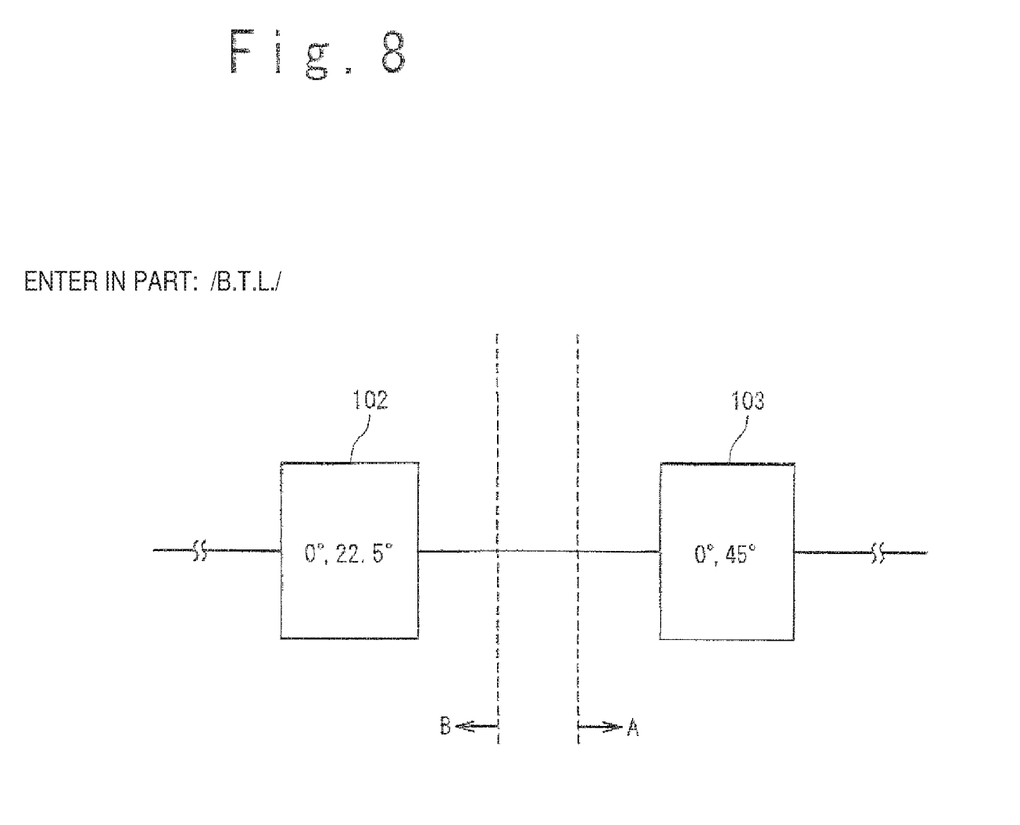
FIG. 8 is a diagram to explain a connection state between phase shifters.

A connection state between the phase shifter 102 and the phase shifter 103 will be described in detail. As shown in FIG. 8, impedance of the phase shifter 103 viewed from the phase shifter 102 side is capacitive impedance as described above. The impedance is shown in a position on a Smith chart shown in FIG. 9 by a reference symbol A. Meanwhile, the impedance of the phase shifter 102 viewed from the phase shifter 103 side has also a capacitive impedance as long as the phase shifters 102 and 103 use similar SPDT switches. The impedance is shown on the Smith chart shown in FIG. 9 by a reference symbol B which is the same as the reference symbol A. Although it is impossible to obtain a same capacitance in the two phase shifters 102 and 103 due to different phase shift amounts, the description will be given under the assumption of the attainment of an equivalent capacitance. In the Smith chart of FIG. 9, the reference symbol B needs to be disposed on a conjugate position of the reference symbol A (i.e. position of a reference symbol A*) so that the impedance indicated by the reference symbol A is matched to the impedance indicated by the reference symbol B. Therefore, there is a positional difference error between the reference symbol B and the reference symbol A*.

Figure 9:
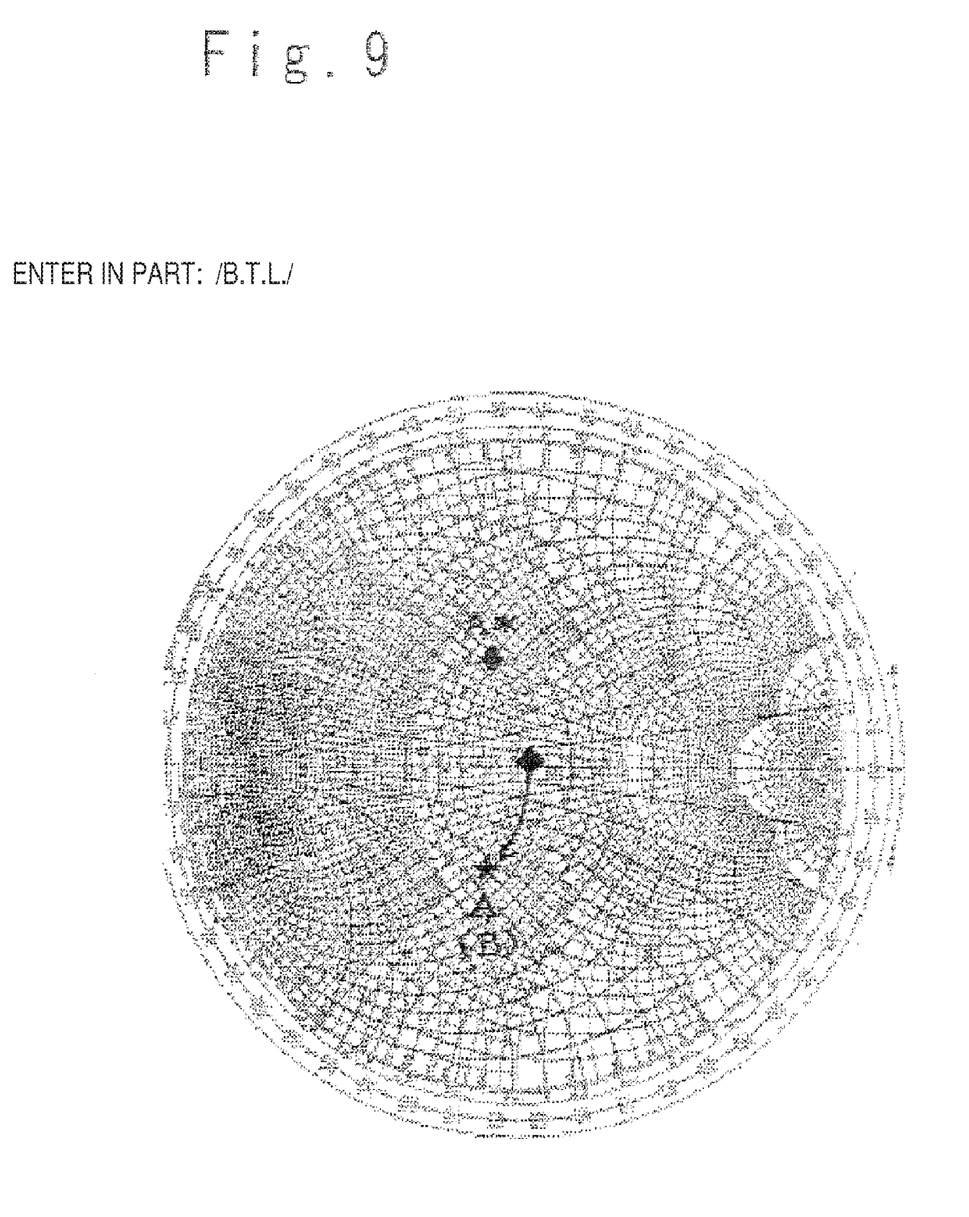
FIG. 9 is a Smith chart expressing a connection state between the phase shifters.

Since the reference symbol A* has inductive impedance exceeding 50 ohm as the impedance viewed from the reference symbol B as shown in FIG. 9, a deviation is increased more than the deviation of 50 ohm in the single phase shifter. This deviation leads to a mismatch between the reference symbol A* and the reference symbol B in case of connecting the phase shifters one after another, and leads to a mismatch between the reference symbol A* and the center of the Smith chart in the single phase shifter. Accordingly, if these phase shifters are connected in series in multiple stages, an adverse influence of an impedance deviation is gradually increased and the bit phase shifter deteriorates. Furthermore, in many cases, individual phase shifters are designed to have desired phase characteristics when they are connected to the load of 50 ohm, and accordingly it is impossible to obtain originally designed phase characteristics of the phase shifters when return loss becomes adverse so that connection condition is deviated from 50 ohm. As a result, the bit phase shifter cannot have the characteristics determined based on characteristics of the individual phase shifters, so that a phase error of the bit phase shifter is increased.

The results are the same even if the SPDT switches 122 and 123 are of the series shunt type, as shown in FIG. 4. In FIG. 4, the shunt FETs F22 and F24 are turned off when the FETs F18 and F20 are turned on, and off capacitances at the off time are connected to the shunt circuit in an equivalent circuit. Similarly, the shunt FETs F23 and F25 are turned off when the FETs F19 and F21 are turned on, and the off capacitances are connected to the shunt circuit in the equivalent circuit. That is, the off capacitance is connected to an on-side signal path for the high frequency signal. Accordingly, the phase shifter of FIG. 4 having the SPDT switches of the series shunt type also has capacitive impedance in the high frequency band in the same manner as the phase shifter of FIG. 3.

As described above, in the conventional bit phase shifter, impedance deviation in individual phase shifters in the high frequency band cannot meet a severe performance requirement. Attention is focused on a characteristic tendency of adding capacitive impedance when phase shifters having SPDT switches are connected in series in multiple stages. Accordingly, the art needs a bit phase shifter having excellent phase characteristics in a high frequency band in which phase shifters are connected so as not to superimpose capacitive impedance associated with the SPDT switches.

SUMMARY OF THE INVENTION

In an aspect of the present invention, a bit phase shifter includes a plurality of phase shifters having phase shift amounts and connected in series through connection paths; and a first adjusting circuit provided in the connection path between every adjacent two of the plurality of phase shifters. The first adjusting circuit includes a first inductance which attains impedance matching to each of capacitances provided by the adjacent two phase shifters.

In another aspect of the present invention, a bit phase shifter includes a plurality of phase shifters having phase shift amounts and connected in series through connection paths; and a first adjusting circuit provided in the connection path between every adjacent two of the plurality of phase shifters. The first adjusting circuit includes two capacitors connected in series; and a first inductance connected between the two capacitors and configured to attain impedance matching to each of capacitances provided by the adjacent two phase shifters.

According to the present invention, a bit phase shifter for a high frequency band can be fabricated with excellent phase characteristics by connecting phase shifters so as not to superimpose capacitive impedance associated with SPDT switches.

BRIEF DESCRIPTION OF THE DRAWINGS

The above and other objects, advantages and features of the present invention will be more apparent from the following description of certain preferred embodiments taken in conjunction with the accompanying drawings, where like features are designated by the same reference labels in the different drawing figures, and in which.

DESCRIPTION OF THE PREFERRED EMBODIMENTS

Figure 10:
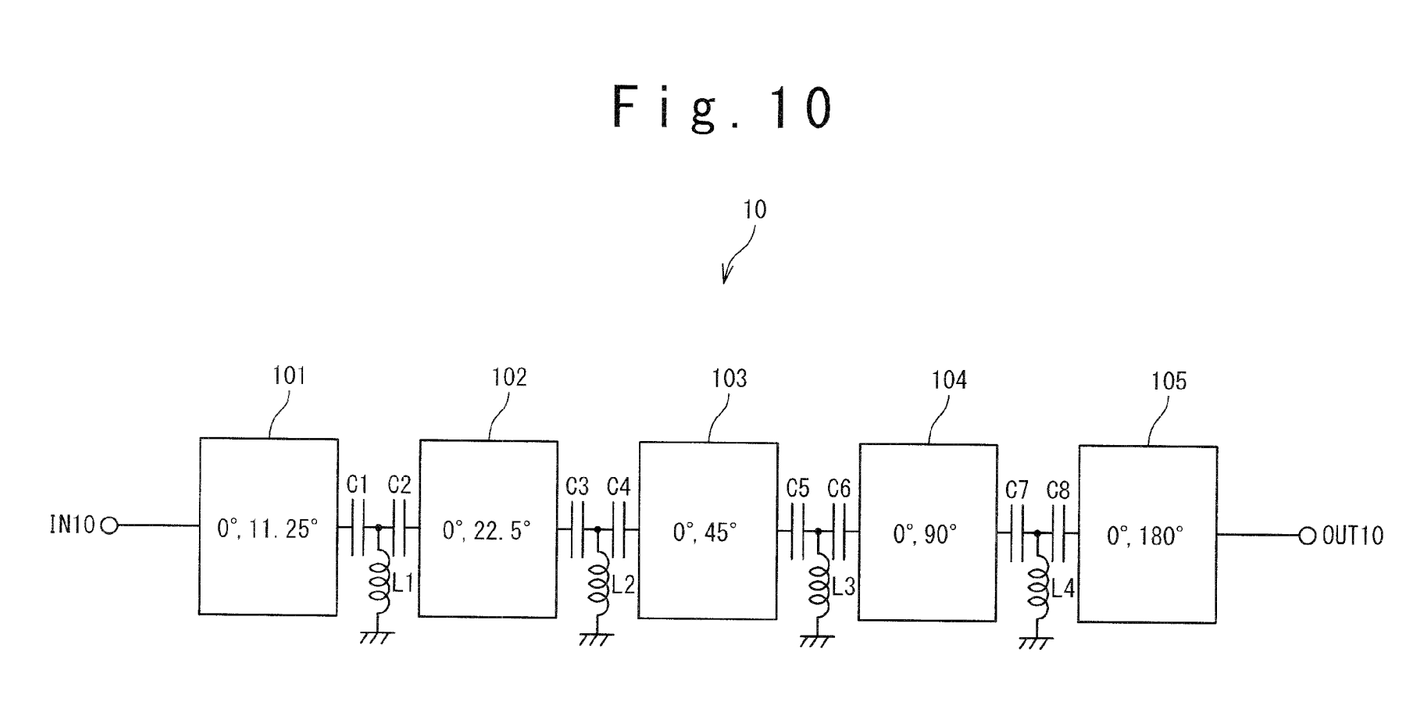
FIG. 10 is a circuit diagram showing a bit phase shifter according to a first embodiment of the present invention.

A bit phase shifter formed by connecting a plurality of versatile phase shifters with predetermined phase shift amounts in series according to embodiments of the present invention will be described with reference to the attached drawings. Here, it is assumed that switches of the phase shifter are a resonance type of SPDT switches or a series shunt type of SPDT switches. The bit phase shifter provides that capacitances are connected in series and that a shunt inductor between a node between these capacitances and a ground is in a connection path of the two phase shifters. Therefore, phase characteristics such as a phase error are improved while removing a mismatch between the phase shifters and preventing deterioration of a return loss in the bit phase shifter. FIG. 10 is a circuit diagram of the bit phase shifter according to the present embodiment.

As shown in FIG. 10, in a bit shifter 10 according to the embodiment of the present invention, which includes an input terminal IN10 and an output terminal OUT10, an adjusting circuit is provided in connection paths between adjacent two of the phase shifters 101, 102, 103, 104 and 105, where the adjusting circuit includes respective pairs of adjacent capacitors connected in series, C1-C2, C3-C4, C5-C6, and C7-C8, and a corresponding one of shunt inductors L1, L2, L3, and L4, where the inductors are connected between a node between the two capacitors and a ground. The phase shifters 101 to 105 have different fixed phase shift amounts of, namely 0° to 11.25°, 22.5°, 45°, 90°, and 180°, respectively.

In FIG. 10, deterioration of a return loss between a switching type of phase shifters can be prevented by the functions of the inductors L1 to L4 arranged in the connection paths. That is, it is made possible to provide a bit phase shifter for a high frequency band having excellent characteristics of a large return loss and a small phase error. Meanwhile, the capacitors C1 to C8 provided in the present embodiment prevent common terminals of the SPDT switches connected with the capacitors C1 to C8 from being short-circuited directly to a ground. Therefore, the phase shifters 101 to 105 can operate using a positive power supply. In the bit phase shifter according to the present embodiment, a behavior feature of impedance of the phase shifter in high frequency band has been discovered and the new adjusting circuit is arranged in the connection path between the adjacent phase shifters. As a result, the problems arising when the existing phase shifters are applied to the bit phase shifter for a high frequency band can be overcome.

Figure 11:
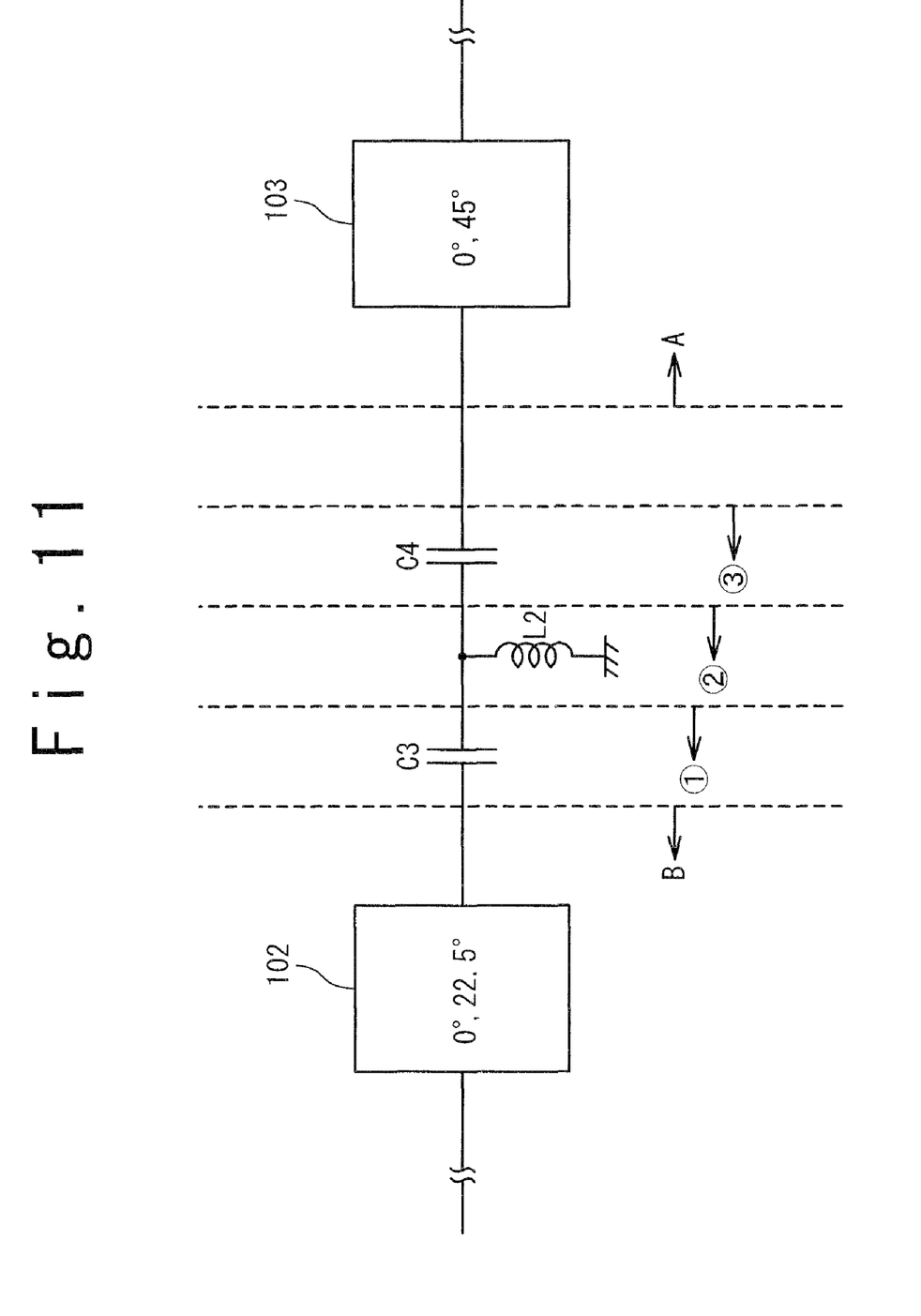
FIG. 11 is a diagram to explain circuit characteristics.
Figure 12:
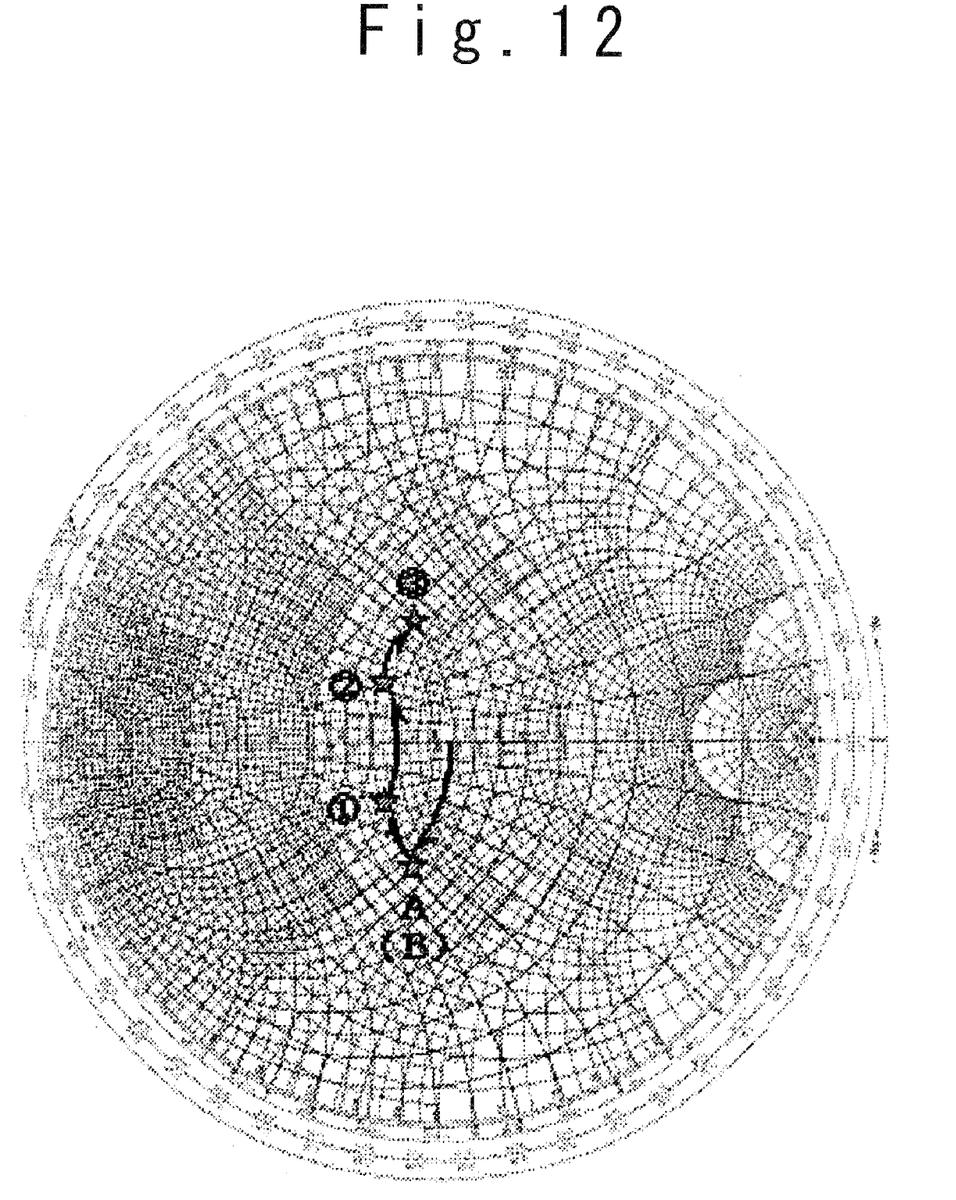
FIG. 12 is a Smith chart to explain circuit characteristics.

In an example of connecting the phase shifter 102 and the phase shifter 103 in FIG. 10, the shunt inductor L2 is provided between the series-connected capacitors C3 and C4 between the phase shifter 102 and the phase shifter 103. Circuit characteristics will be described with reference to FIGS. 11 and 12. FIG. 11 shows a connection state between the phase shifter 102 and the phase shifter 103 in FIG. 10. The impedances viewed from respective points indicated by dotted lines in FIG. 11 are shown on a Smith chart of FIG. 12. Respective impedances indicated by reference symbols A, B, (1), (2), and (3) of FIG. 11 are plotted as star marks in the Smith chart of FIG. 12. As shown in FIG. 12, the impedance of the phase shifter 102 is disposed in a star mark position added with the reference symbol B, and the impedance of the phase shifter 103 is disposed in a star mark position added with the reference symbol A. As shown in FIG. 12, the star mark position added with the reference symbol A and the star mark position added with the reference symbol B are on positions showing an equivalent capacitance value. Since the two phase shifters 102 and 103 have different phase shift amounts in practice, it is impossible to obtain the same capacitance, but they will be described as having the equivalent capacitive value, for easy understanding.

The capacitor C3 in FIG. 11 is arranged in the present embodiment. The impedance of the phase shifter 102 side including the capacitor C3 is moved to the star mark position added with the reference symbol (1), as shown in FIG. 12. The inductor L2 in FIG. 11 is also arranged in the present embodiment. The impedance of the phase shifter 102 side including the inductor L2 is moved to the star mark position added with the reference symbol (2), as shown in FIG. 12. The capacitor C4 in FIG. 11 is also arranged in the present embodiment. The impedance of the phase shifter 102 side including the capacitor C4 is moved to the star mark position added with the reference symbol (3), as shown in FIG. 12. The star mark position added with the reference symbol (3) is a conjugate position with respect to the star mark position added with the reference symbol A. Therefore, the impedance of the phase shifter 102 side viewed from the phase shifter 103 is conjugated, and matching can be achieved.

Simple matching is realized by only arranging the shunt inductor L2. However, in case of using SPDT switches operating with a positive power supply voltage, like the phase shifter described in Japanese Patent No. 3031227, the phase shifters cannot perform a normal operation with the positive power supply voltage if a common terminal of the SPDT switch L2 is short-circuited to the ground by the shunt inductor L2. Accordingly, in the present embodiment, the inductor L2 is put between the capacitors C3 and C4 in order to overcome the above problem.

Connection between the phase shifter 102 and the phase shifter 103 has been described in detail with reference to FIGS. 11 and 12. The same can be applied to a connection between the other adjacent phase shifters. As shown in FIG. 10, each of the shunt inductors L1 to L4 put between series-connected adjacent two of the capacitors C1 to C8 is arranged between adjacent two of the phase shifters 101 to 105, so that a conjugate relationship is provided between the phase shifters 101 to 105. Accordingly, the phase shifters 101 to 105 can be connected one after another without having any mismatch. Open stubs (not shown) of a distributed constant circuit are generally used for the shunt inductors L1 to L4.

Particularly, when signal paths are switched in the phase shifters 101 to 105 of FIG. 10 by using SPDT switches having a similar circuit configuration, two of the capacitor C1 to C8 sandwiching one of the shunt inductors L1 to L4 between the two capacitors may have a same capacitance. If the two capacitors have the same capacitance, matching between the phase shifters can be attained regardless of the same capacitance. Of course, slightly different capacitance values are used when the phase shifters using SPDT switches of different circuit constants are used. Although the phase shifters generally used in a bit phase shifter are assumed to have a single predetermined phase shift amount, they may have a plurality of phase shift amounts if variable capacitance elements or variable resistance elements such as FETs and diodes are used. Also, even if the phase shifters 101 to 105 are replaced with phase shifters which can have such phase shift amounts, they can be applied to the bit phase shifter according to the present embodiment as long as the phase shifters are connected in series to switch signal paths by SPDT switches.

Figure 13:
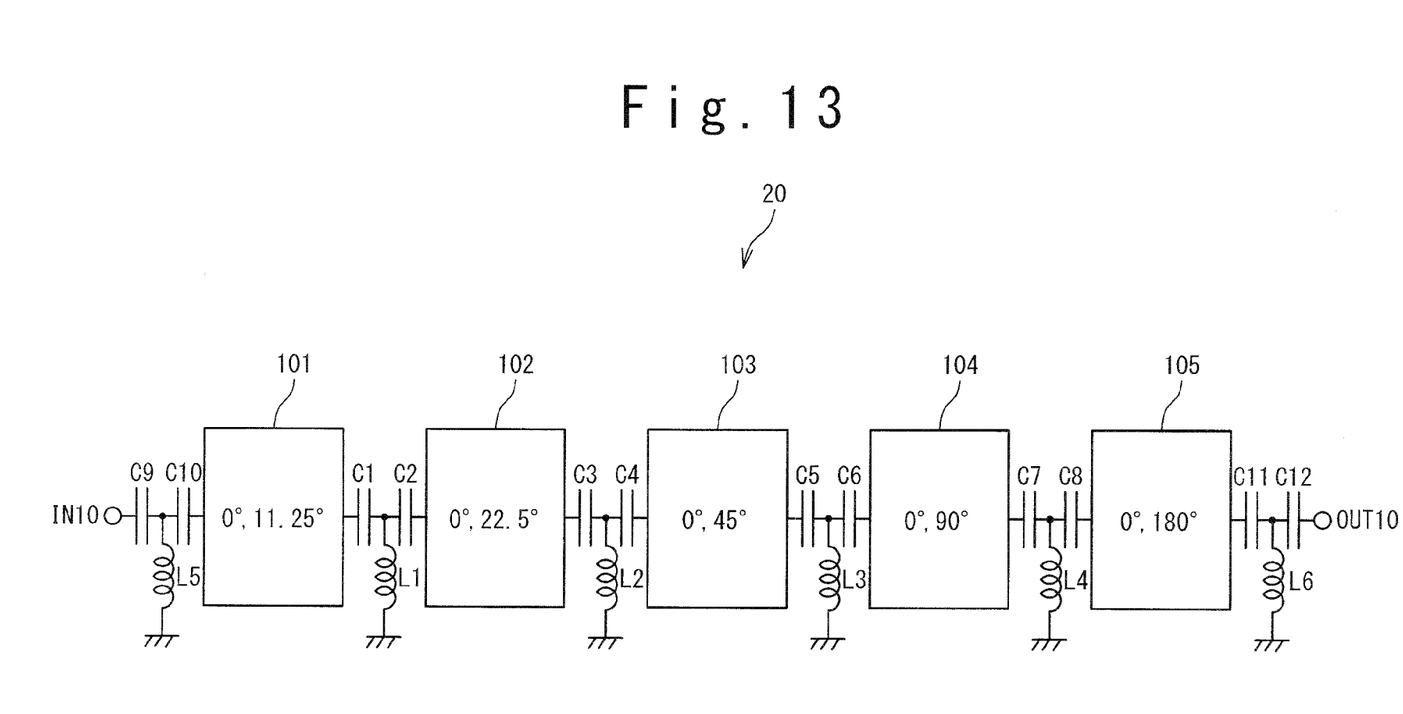
FIG. 13 is a circuit diagram showing the bit phase shifter according to a second embodiment of the present invention.

FIG. 13 shows a circuit diagram of the bit phase shifter according to a second embodiment of the present invention. A bit phase shifter 20 shown in FIG. 13 is formed by adding capacitors C9, C10, C11, and C12 and shunt inductors L5 and L6, to the bit phase shifter 10 of FIG. 10. An adjusting circuit composed of the capacitors C9 and C10 and the shunt inductor L5 is arranged between an input terminal IN10 and the phase shifter 101, and the adjusting circuit composed of the capacitors C11 and C12 and the shunt inductor L6 is arranged between the phase shifter 105 and an output terminal OUT10. Each of the capacitors C9 to C12 has a capacitance which has a sufficiently low impedances in a used frequency band. Each of the shunt inductors L5 and L6 has an inductance which is about double of that of the shunt inductors L1, L2, L3 and L4 arranged between the phase shifters 101, 102, 103, 104 and 105. The inductances of the inductors L5 and L6 are approximately doubled to allow improvement of input/output matching in the bit phase shifter. This is because the phase shifters 101 and 105 on both ends are connected to the load of 50 ohm instead of being connected to the phase shifters.

In the first embodiment shown in FIG. 10, the adjusting circuits C1 to C8 and L1 to L4 are arranged between the phase shifters 101 to 105, for improving performance of the bit phase shifter 10. On the contrary, in the second embodiment shown in FIG. 13, the adjusting circuits C9 to C12, L5 and L6 are arranged on the outsides of the phase shifters 101 and 105 on both ends, and a relationship that the inductances of the adjusting circuits C9 to C12, L5 and L6 are about double of the inductance of the adjusting circuits C1 to C8 and L1 to L4, in addition to arrangement of the adjustment circuits C1 to C8 and L1 to L4 between the phase shifters 101 to 105 for improving performance of the bit phase shifter 20. The second embodiment shown in FIG. 13 uses the first embodiment shown in FIG. 10 in a further practical manner.

Figure 14:
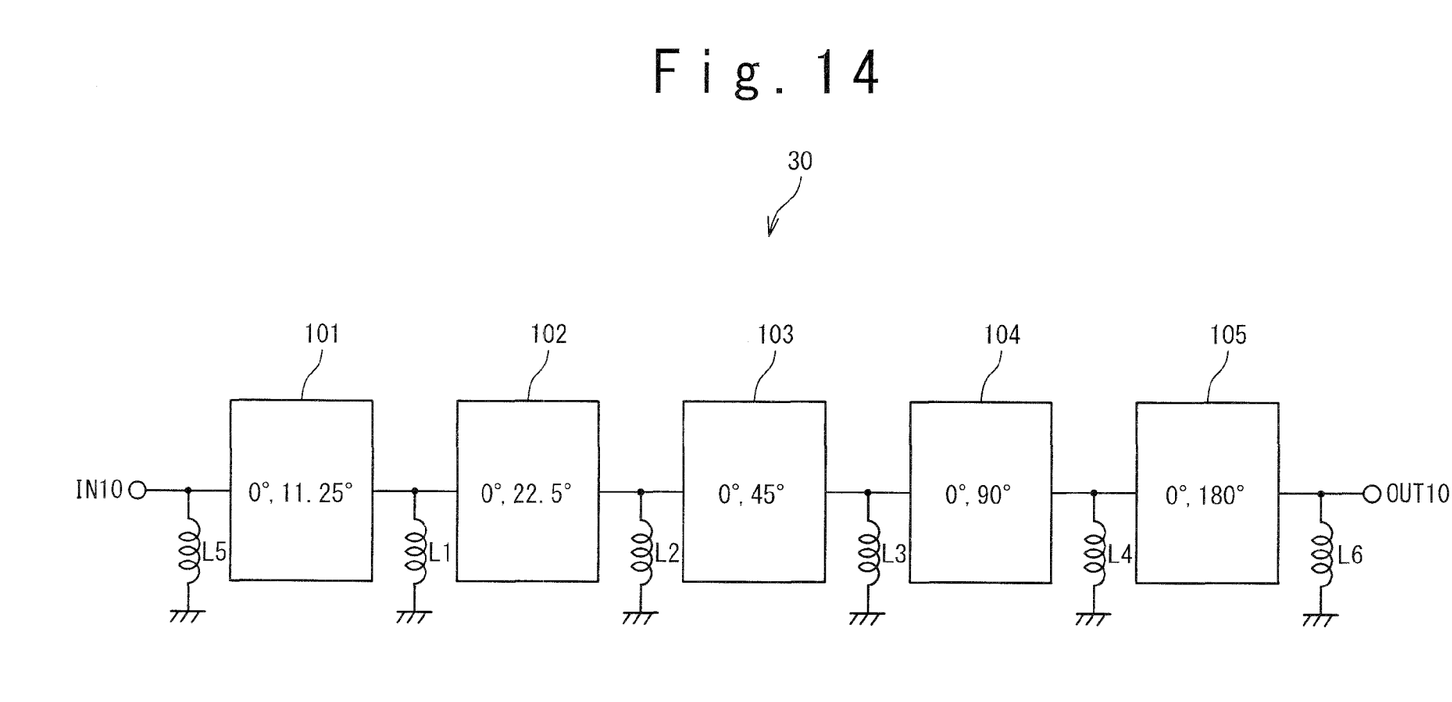
FIG. 14 is a circuit diagram showing the bit phase shifter according to a third embodiment of the present invention.

FIG. 14 is a circuit diagram showing the bit phase shifter according to a third embodiment of the present invention. A bit phase shifter 30 shown in FIG. 14 is formed by removing the capacitors C1, C2, C3, C4, C5, C6, C7, C8, C9, C10, C11 and C12 from the bit phase shifter 20 of FIG. 13. If the SPDT switches in the phase shifters 101, 102, 103, 104 and 105 are not circuits operating with the positive power supply voltage, common terminals of the switches may be short-circuited to the ground via the shunt inductors L1, L2, L3, L4, L5, and L6. In this case, the capacitors C1 to C12 may be removed, like the bit phase shifter 30 shown in FIG. 14. From a different viewpoint, the bit phase shifter of FIG. 14 can be considered as an example of FIG. 13, i.e. considered as a case that the capacitances of the capacitors C1 to C12 in FIG. 13 are set to be infinite (Z=1/(jωC); C=∞).

The degrees of capacitive impedances the individual phase shifters connected in cascade have is dependent on circuit configurations of the SPDT switches. If the SPDT switches have a large FET size, an off capacitance of the FET becomes larger, and the phase shifters are largely inclined to capacitive impedance. In the present invention, there is a problem in the connection of the phase shifters showing the capacitance of 0.01 pF or larger depending on a capacitor appeared in an equivalent circuit of the SPDT switches. If the capacitance of 0.01 pF or larger is present, a return loss can be sufficiently improved in the present invention. Moreover, in the present invention, the bit phase shifter particularly used in the C band (4 to 8 GHz), X band (8 to 12 GHz), Ku band (12 to 18 GHz), and K band (18 to 26 GHz) can be achieved. If the present invention is applied to the connection of the phase shifters showing the capacitance of 0.02 pF or larger in the bit phase shifter used in the Ku band and the K band among these bands, a more practical bit phase shifter can be provided. If the present invention is applied to the connection of the phase shifters showing the capacitance of 0.05 pF or larger in the bit phase shifter used in the X band, a more practical bit phase shifter can be provided. If the present invention is applied to the connection of the phase shifters showing the capacitance of 0.20 pF or larger in the bit phase capacitor used in the C band, a more practical bit phase shifter can be provided. Furthermore, phase shifters showing the capacitance of 1.00 pF or larger are not used in the bit phase shifter according to the present invention. This is because such phase shifters are considered to be unusable in high frequency bands. That is, in an embodiment of the invention, an impedance of one of the plurality of phase shifters viewed from the connection path shows a capacitance of 0.01-1.00 pF as a capacitor which appears in an equivalent circuit of the SPDT switch of the phase shifter.

Although the inventions has been described above in connection with several embodiments thereof, it will be appreciated by those skilled persons in the art that those embodiments are provided solely for illustrating the present invention, and should not be relied upon to construe the appended claims in a limiting sense.

What is claimed is:

1. A bit phase shifter comprising:
   a plurality of phase shifters having phase shift amounts and connected in series through connection paths;
   a first adjusting circuit provided in said connection path between every adjacent two of said plurality of phase shifters; and
   second adjusting circuits provided between an input terminal and a first one of said plurality of phase shifters and between an output terminal and a last one of said plurality of phase shifters,
   wherein each said first adjusting circuit comprises a first inductance which attains impedance matching to said adjacent two phase shifters, and
   wherein each of said second adjusting circuits comprises,
   second inductances which attain impedance matching to the first one and the last one of said plurality of phase shifters, respectively, and
   two capacitors connected in series, with a respective one of said second inductances between said two capacitors.

2. The bit phase shifter according to claim 1, wherein each of said plurality of phase shifters comprises a single pole double throw (SPDT) switch, and
   said SPDT switch is of a resonance type or a series shunt type.

3. The bit phase shifter according to claim 2, wherein an impedance of one of said plurality of phase shifters viewed from a respective one of said connection paths shows a capacitance of 0.01-1.00 pF.

4. The bit phase shifter according to claim 2, wherein each said SPDT switch comprises a FET (Field effect transistor) connected to a respective one of said connection paths, and each said FET is controlled by applying a voltage equal to or higher than 0 volt to a corresponding gate of each said FET.

5. The bit phase shifter according to claim 4, wherein each said first adjusting circuit further comprises two capacitors connected in series, wherein said corresponding first inductance is between said two capacitors.

6. The bit phase shifter according to claim 1, wherein each said second inductance is of a shunt inductor.

7. The bit phase shifter according to claim 1, wherein each said first inductance is of a shunt inductor.

8. The bit phase shifter according to claim 1, wherein each said second inductance is about double of each said first inductance.

9. A bit phase shifter comprising:
- a plurality of phase shifters having phase shift amounts and connected in series through connection paths;
- a first adjusting circuit provided in said connection paths between every adjacent two of said plurality of phase shifters; and
- second adjusting circuits provided between an input terminal and a first one of said plurality of phase shifters and between an output terminal and a last one of said plurality of phase shifters, wherein each said first adjusting circuit comprises,
two first capacitors connected in series, and
a first inductance connected between said two first capacitors and configured to attain impedance matching to said adjacent two phase shifters, and wherein each of said second adjusting circuits comprises,
two second capacitors connected in series, and
a second inductance connected between said two second capacitors and configured to attain impedance matching to one of the first one and the last one of said plurality of phase shifters.

10. The bit phase shifter according to claim 9, wherein each of said plurality of phase shifters comprises a single pole double throw (SPDT) switch switches, and
said SPDT switch is of a resonance type or a series shunt type.

11. The bit phase shifter according to claim 10, wherein each said SPDT switch comprises a FET (Field effect transistor) connected to a respective one of said connection paths, and
each said FET is controlled by applying a voltage equal to or higher than 0 volt to a corresponding gate of each said FET.

12. The bit phase shifter according to claim 9, wherein each said second inductance is about double each said first inductance.

* * * * *